US009625808B2

United States Patent
Huang et al.

(10) Patent No.: US 9,625,808 B2
(45) Date of Patent: Apr. 18, 2017

(54) DURABLE METAL FILM DEPOSITION FOR MASK REPAIR

(71) Applicant: Taiwan Semiconductor Manufacturing Company, Ltd., Hsin-Chu (TW)

(72) Inventors: Yen-Kai Huang, Hsinchu (TW); Yuan-Chih Chu, New Taipei (TW)

(73) Assignee: TAIWAN SEMICONDUCTOR MANUFACTURING COMPANY, LTD., Hsin-Chu (TW)

( * ) Notice: Subject to any disclaimer, the term of this patent is extended or adjusted under 35 U.S.C. 154(b) by 48 days.

(21) Appl. No.: 14/621,897

(22) Filed: Feb. 13, 2015

(65) Prior Publication Data
US 2016/0238928 A1    Aug. 18, 2016

(51) Int. Cl.
G03F 1/72    (2012.01)
G03F 1/74    (2012.01)

(52) U.S. Cl.
CPC . *G03F 1/72* (2013.01); *G03F 1/74* (2013.01)

(58) Field of Classification Search
None
See application file for complete search history.

(56) References Cited

U.S. PATENT DOCUMENTS

| | | | |
|---|---|---|---|
| 4,778,693 A | 10/1988 | Drozdowicz et al. | |
| 5,639,699 A | 6/1997 | Nakamura et al. | |
| 5,807,650 A | 9/1998 | Komano et al. | |
| 6,891,171 B1 | 5/2005 | Hagiwara et al. | |
| 8,464,186 B2 | 6/2013 | Wang et al. | |
| 8,468,473 B1 | 6/2013 | Wang et al. | |
| 8,473,877 B2 | 6/2013 | Wang et al. | |
| 8,507,159 B2 | 8/2013 | Wang et al. | |
| 8,510,687 B1 | 8/2013 | Liu et al. | |
| 8,524,427 B2 | 9/2013 | Shin et al. | |

(Continued)

FOREIGN PATENT DOCUMENTS

| JP | 2002-08847 | 3/2002 |
|---|---|---|
| KR | 1020070057302 | 12/2008 |

(Continued)

OTHER PUBLICATIONS

Taiwan Office Action issued in Patent Application No. 104126340 on Nov. 2, 2016.

(Continued)

*Primary Examiner* — Stephen Rosasco
(74) *Attorney, Agent, or Firm* — Haynes and Boone, LLP

(57) ABSTRACT

Methods and tools for repairing a semiconductor mask are provided. The method includes steps of positioning the semiconductor mask within a repair chamber including a repair tool, supplying a first gas and a second gas into the repair chamber. The first gas includes a repair material for repairing a defect on the mask, and the second gas includes a polar gas and assists deposition of the repair material on the semiconductor mask. The method further includes steps of activating the repair tool such that the repair tool interacts with the first and second gases to deposit the repair material at the site of the defect to repair the semiconductor mask and removing the repaired semiconductor mask from the repair chamber. A dimension of the deposited repair material is less than about 32 nanometers.

20 Claims, 6 Drawing Sheets

(56) References Cited

U.S. PATENT DOCUMENTS

| | | |
|---|---|---|
| 8,530,121 B2 | 9/2013 | Wang et al. |
| 8,563,224 B1 | 10/2013 | Chen et al. |
| 8,584,057 B2 | 11/2013 | Liu et al. |
| 8,601,407 B2 | 12/2013 | Wang et al. |
| 8,609,308 B1 | 12/2013 | Chen et al. |
| 8,627,241 B2 | 1/2014 | Wang et al. |
| 8,677,511 B2 | 3/2014 | Wang et al. |
| 8,762,900 B2 | 6/2014 | Shin et al. |
| 8,822,106 B2 | 9/2014 | Wang et al. |
| 8,828,632 B2 | 9/2014 | Wang et al. |
| 8,835,082 B2 | 9/2014 | Chen et al. |
| 8,841,049 B2 | 9/2014 | Wang et al. |
| 8,846,278 B2 | 9/2014 | Shin et al. |
| 2004/0151991 A1 | 8/2004 | Stewart et al. |
| 2004/0224237 A1* | 11/2004 | Lin .......................... G03F 1/72 430/5 |
| 2011/0017401 A1 | 1/2011 | Williamson et al. |
| 2013/0202992 A1 | 8/2013 | Chen et al. |

FOREIGN PATENT DOCUMENTS

| | | |
|---|---|---|
| TW | 201426166 | 7/2014 |
| WO | WO0065406 | 11/2000 |

OTHER PUBLICATIONS

K. Edlinger et al., Bringing Mask Repair to the Next Level, Proceedings Paper, Oct. 17, 2014, pp. 1-10, SPIE Proceedings vol. 9235: Photomask Technology 2014, Robdorf, Germany.

Korean Office Action issued May 11, 2016 in Patent Application No. 10-2015-0060520.

German Office action issued Nov. 20, 2015 in Patent Application No. 102015103260.0.

Edinger et al., Bringing Mask Repair to the Next Level, Published in SPIE Proceedings, vol. 9235, Oct. 17, 2014, 9 pages.

* cited by examiner

DURABLE METAL FILM DEPOSITION FOR MASK REPAIR

BACKGROUND

A semiconductor wafer is processed by a semiconductor manufacturer to form various integrated circuits (IC) in different regions of the wafer. The wafer includes a substrate with many patterned material layers thereon that form the discrete devices that make up a circuit. The material layers are patterned by photolithographic steps using photomasks, or simply "masks," to expose a photoresist layer which may then serve as an etch mask during a patterning etch process. During fabrication various defects may be introduced on or in the wafers or the photomasks used to pattern the wafers. Additionally, when a mask is used in photolithography, defects may be introduced by that use. For example, when subjected to several cleaning processes a mask feature may lose material, altering in shape from the design layout used to create that mask. In some instances, small features such as assist features, which are not intended to be transferred from the mask into the underlying photoresist layer, may detach from the mask after several cleanings. The current approaches to pattern repair have not been entirely satisfactory. Therefore, there is a need of new methods and tools to address such issues.

BRIEF DESCRIPTION OF THE DRAWINGS

It is emphasized that, in accordance with the standard practice in the industry, various features of the included drawings are not drawn to scale. In fact, the dimensions of the various features may be arbitrarily increased or reduced for clarity of discussion.

Figure 1A:
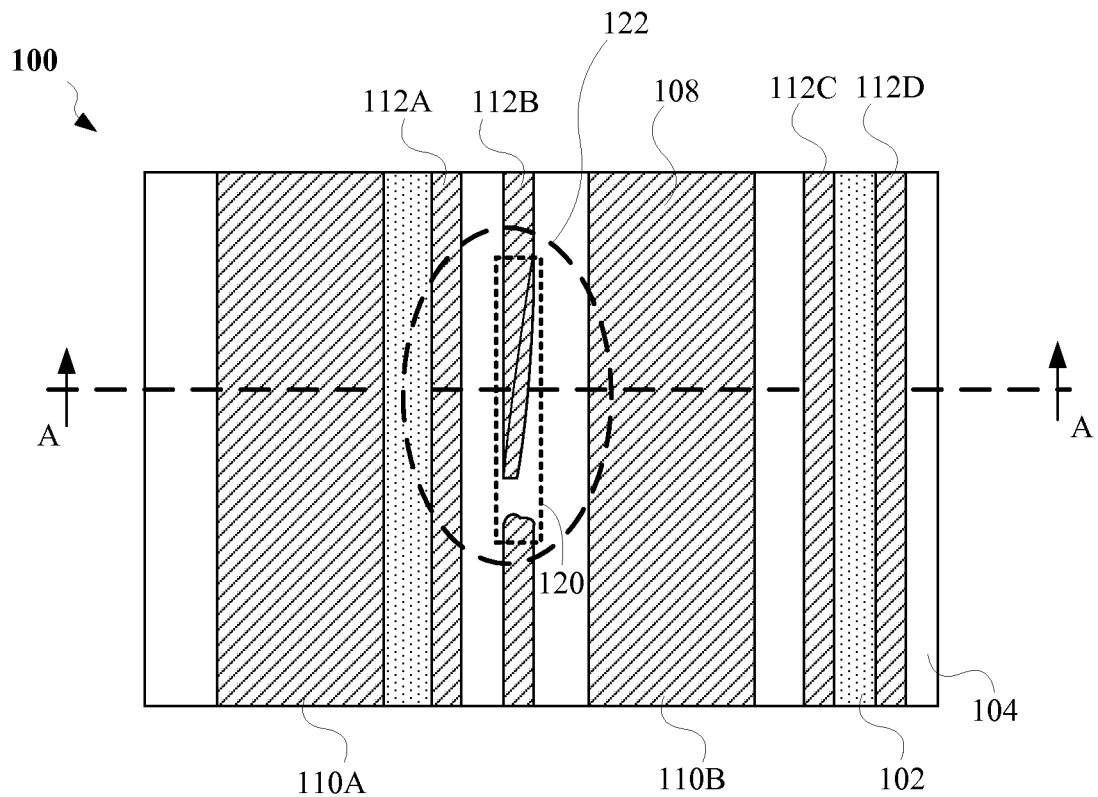
FIG. 1A is a top view of an embodiment of a photomask having a defect thereon.

The drawings may be better understood when viewed in connection with the following detailed description.

DETAILED DESCRIPTION

It is to be understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

It is understood that several processing steps and/or features of a device, wafer, or system may be only briefly described, such steps and/or features being well known to those of ordinary skill in the art. Also, additional processing steps or features can be added and certain of the following processing steps or features can be removed and/or changed while still implementing the claims. Thus, the following description should be understood to represent examples only and are not intended to suggest that one or more steps or features is required.

It is further understood that the present disclosure refers generally to photolithographic processing. Various embodiments are provided herein for a photomask, for a method of repairing a semiconductor mask, and a chamber that may be used in repairing such semiconductor masks. Furthermore, specific embodiments may be described herein which are exemplary only and not intended to be limiting. As used herein, a semiconductor mask describes a mask for use in photolithographic patterned of wafers of semiconductor devices. The semiconductor mask may not be made from a semiconducting material. Similarly, a semiconductor substrate may not be made from semiconducting material in some embodiments. Rather a semiconductor substrate, as used herein, may be made from any material upon which semiconductor devices may be fabricated. For example, where a semiconductor mask is described herein, the substrate may be a quartz substrate. Other semiconductor substrates may include a silicon substrate or may alternatively or additionally include other elementary semiconductors, such as germanium. The substrates may also include a compound semiconductor, such as silicon carbide, gallium arsenic, indium arsenide, and indium phosphide. Alternatively, the substrates may include a non-semiconductor material such as glass, quartz, calcium fluoride, and/or other suitable material.

Referring now to FIG. 1A, a semiconductor mask 100 is illustrated in a top view diagram. The semiconductor mask 100 may include several layers or groups of layers. As illustrated in FIG. 1A, the mask 100 is a mask for use in an extreme ultraviolet (EUV) photolithography process. Several layers of the mask are visible in FIG. 1A, include a substrate 102, which may be a low thermal expansion material (LTEM) substrate. Over the substrate 102, is a multilayer stack 104, which includes a plurality of alternative material layers. These alternating materials layers may include alternating layers of Mo—Si. A capping layer 106 is located between the multilayer stack 104 and an absorber layer 108, which may be a chrome absorber layer.

Figure 1B:
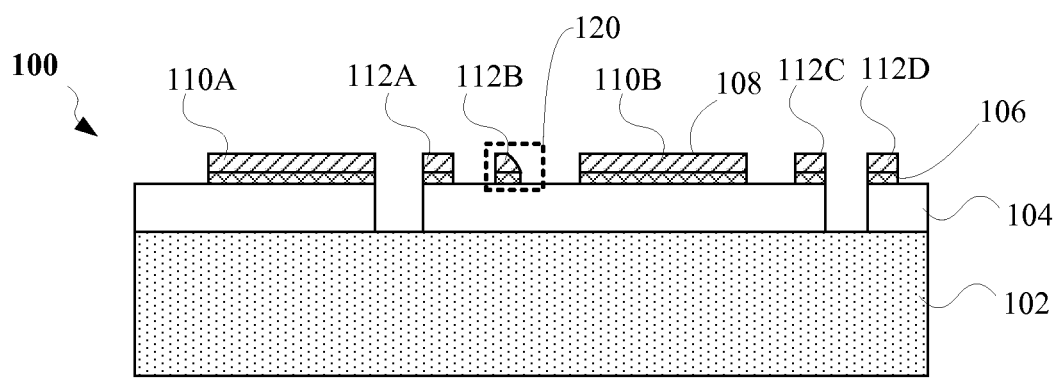
FIG. 1B is a cross-sectional view of the photomask of FIG. 1A, as seen according to line A-A of FIG. 1A.

These layers are also seen in FIG. 1B, which is a cross-sectional view of the mask 100 as seen according to the line A-A of FIG. 1A. As shown in FIGS. 1A and 1B, the absorber layer 108 is patterned and, in some places, the pattern reveals the underlying multilayer stack 104, while in other places the pattern may further reveal the underlying substrate 102. The pattern of the absorber layer 108 includes exemplary main pattern features 110A and 110B, which are intended to be replicated or transferred into a photoresist layer depicted over a semiconductor wafer undergoing device fabrication. In effort to improve the fidelity of transfer of a desired layout that includes the main pattern features 110A and 110B, the absorber layer 108 further includes resolution enhancement features. As illustrated, the absorber layer 108 has been patterned to include scattering bars 112A, 112B, 112C, and 112D. Because FIGS. 1A and 1B, and other similar figures herein, illustrate only a portion of the mask 100, many other features and patterns may be present on the mask 100 in various embodiments. These patterns may be included in both the absorber layer 108 and in patterning of the multilayer stack 104.

As shown in FIGS. 1A and 1B, the mask layout includes a defect 120 located at a site 122. As depicted, the defect 120 includes an absence of material from the scattering bar 112B, which may cause resolution problems, potentially distorting the transfer of the main pattern features 110A or 110B.

Figure 2:
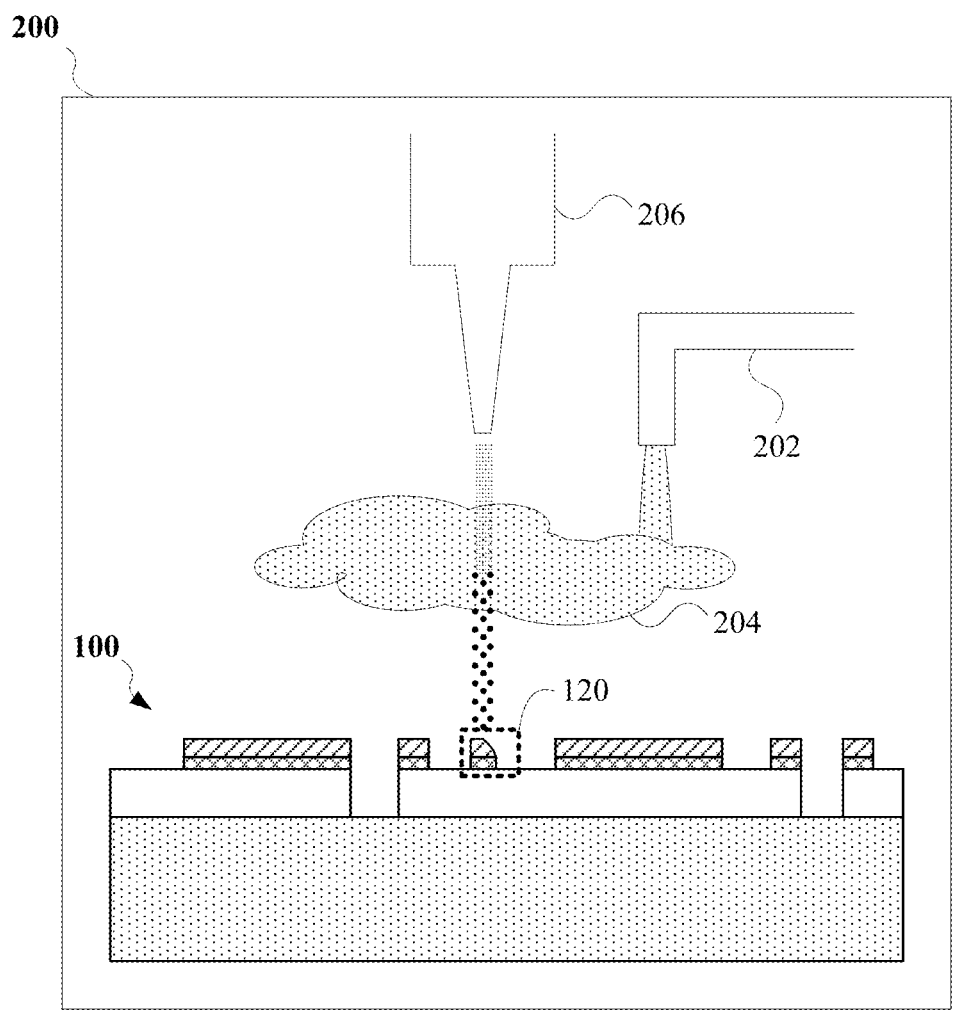
FIG. 2 is a diagram of a repair chamber including a repair tool.

Referring now to FIG. 2, illustrated therein is a diagram of a repair chamber 200. In order to fix or mitigate the defect 120, the mask 100 may be inserted into or positioned within the repair chamber 200. The repair chamber 200 may include an exhaust gas management system to permit evacuation of any gases introduced by the introduction of the mask 100 into the chamber. The chamber 200 also includes an inlet 202 by which a gas 204 may be provided into the chamber. The inlet 202 may be configured to permit the gas 204 to enter the chamber 200 at a selectable flow rate, which may be measured in standard cubic centimeters per minute. The gas 204 may include a repair material. A repair tool 206 is provided to cause molecules within the gas to dissociate, causing the repair material to be deposited in a localized manner. By-product gases may be produced as a result of the dissociation by the exhaust gas management system. These by-product gases may be removed from the chamber 200 via an outlet (not expressly shown) provided as part of the exhaust gas management system. By controlling the repair tool 206 and the flow of the gas 204 from the inlet 202 into the repair chamber 200, the repair material may be deposited in a controlled matter at the site 122 to repair the defect 120.

Figure 3A:
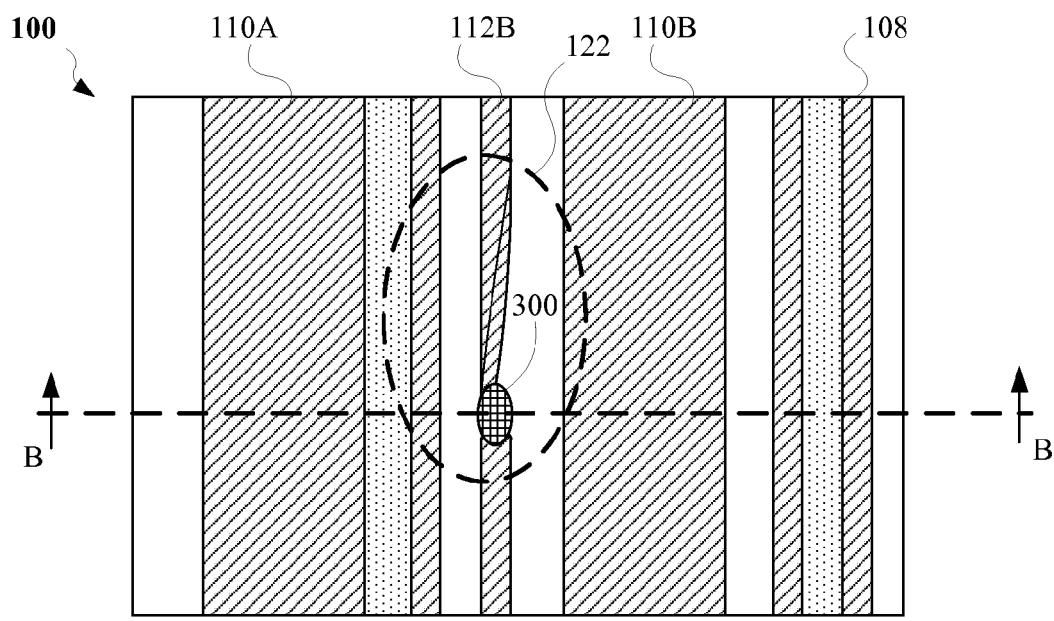
FIG. 3A is a top view of an embodiment of a photomask having a repaired defect thereon.
Figure 3B:
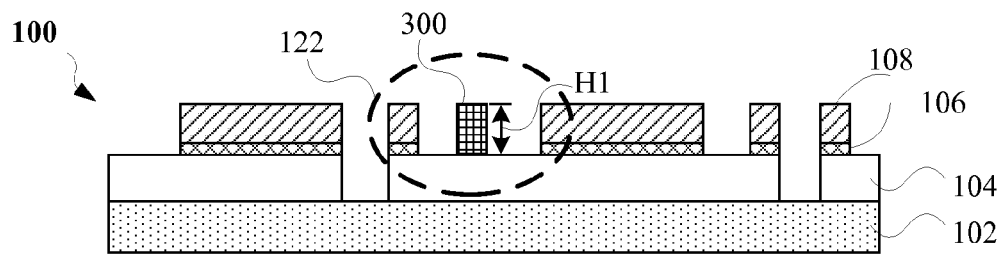
FIG. 3B is a cross-sectional view of the repaired photomask of FIG. 3A, as seen according to line B-B of FIG. 3A.

Referring now to FIGS. 3A and 3B, shown therein are a top view and a cross-sectional view, respectively, of the wafer 100 after undergoing a repair process in the repair tool 200 of FIG. 2. As seen in FIG. 3A, the repair material is deposited as a patch 300. The patch 300 may be shaped in a desired shape by control of the repair tool 206. The patch 300 includes material that is similar to the material of the absorber layer 108, such that with the patch 300, the fidelity of transfer of the main pattern features 110A and 110B into a photoresist layer may be increased.

Figure 3C:
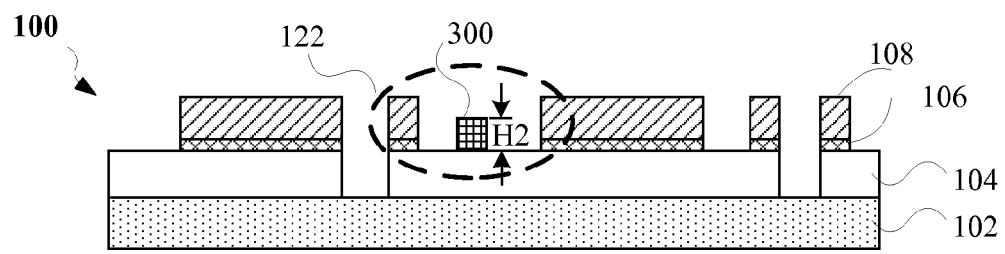
FIG. 3C is a cross-sectional view of the repaired photomask of FIG. 3A, as seen according to line B-B of FIG. 3A, after several cleaning cycles.
Figure 3D:
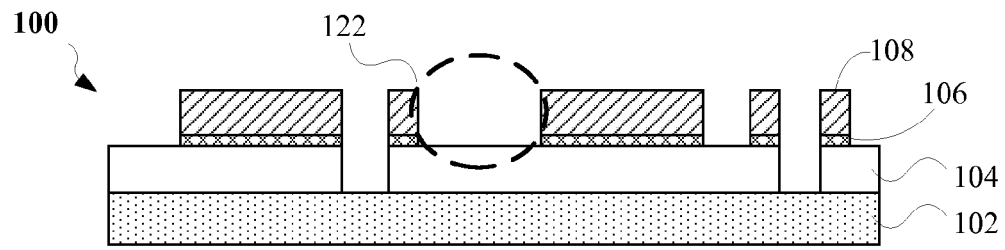
FIG. 3D is a cross-sectional view of the repaired photomask of FIG. 3A, as seen according to line B-B of FIG. 3A, after several more cleaning cycles.

After the conventional repair process is completed, the height of the patch 300 may be as shown in FIG. 3B, approximate the same height H1 as the absorber layer 108. As discussed after a number of uses, the mask 100 may need to be cleaned to remove residues and other imperfections. A wet cleaning process may be used to clean the mask 100. As a result of repeated cleaning processes, the patch 300 may degrade, as seen in FIG. 3C. This may result in a loss of feature height as indicated by comparing the height H2 of the patch 300 with the height H1, prior to subjection to cleaning processes. In practice, it was observed that when the feature size of a patch, such as the patch 300, decreased below 32 nanometers, the properties of the repair material were significantly different from those of the absorber layer 108. The patch 300 became more susceptible to etching during the cleaning process and adhered less to the capping layer 106. After additional cleaning processes, the patch 300 may be completely absent, as seen in FIG. 3D. This may occur due to a failure of the adhesion between the patch 300 and the capping layer 106, or the adhesion between the patch 300 and other layers, in other embodiments. As described herein, the mask 100 is a mask for use in an extreme ultraviolet lithography application. However, the mask 100 may also be a mask for use in other photolithographic processes. In some embodiments, the mask 100 may not include the multilayer stack 104 and/or the capping layer 106. In some embodiments, the mask 100 may include other layers.

In experiments, significant critical dimension change occurred in repaired sites as a result of wet cleaning. This was particularly the case when the feature size of deposited repair material is below 32 nanometers. For example, for particularly small features conventional repairs could detach completely after only a few cleanings.

Figure 4:
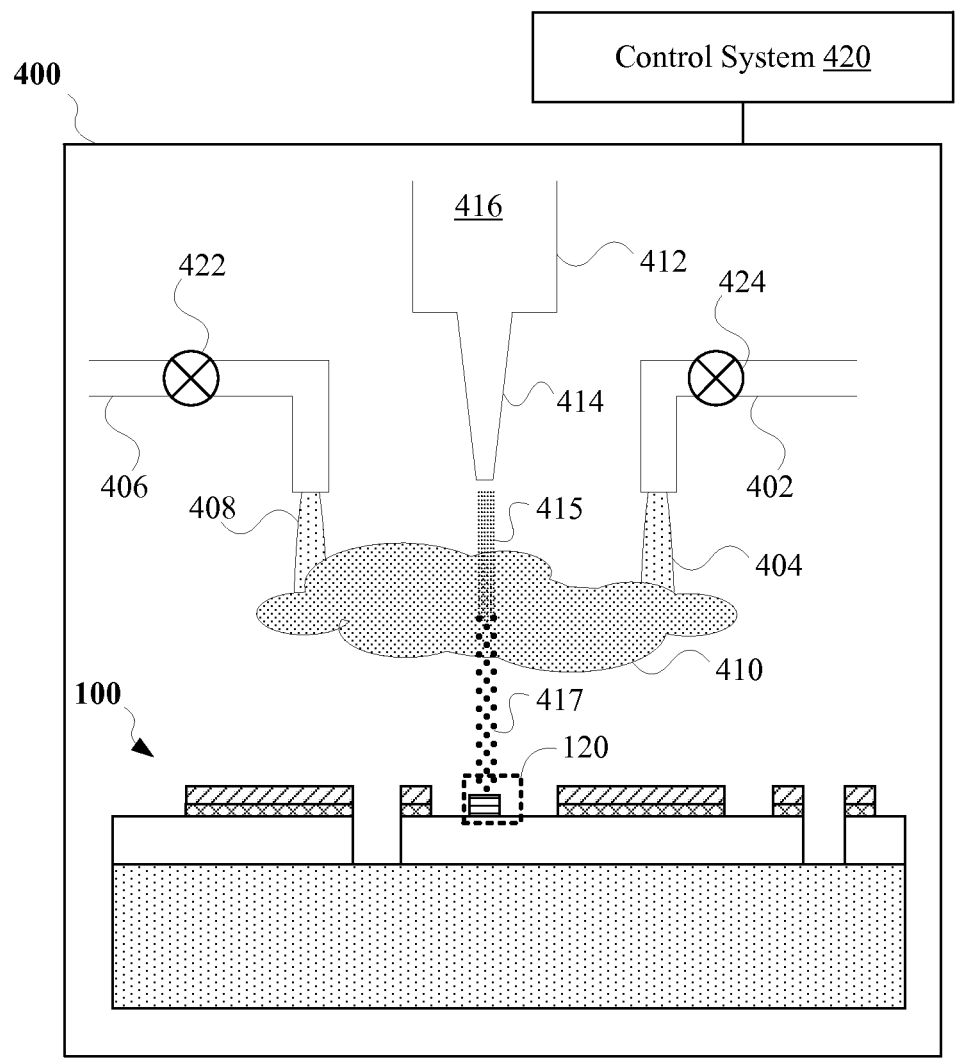
FIG. 4 is a diagram of a repair chamber including a repair tool, according to some aspects of the present disclosure.

Referring now to FIG. 4, a repair chamber 400, according to some aspects of the present disclosure, is illustrated as a diagram. The repair chamber 400 shares many of the features described above in connection with the repair chamber 200 of FIG. 2. In order to fix or mitigate the defect 120, the mask 100 may be inserted into or positioned within the repair chamber 400. The repair chamber 400 permits the evacuation of any gases introduced by the placement of the mask 100 into the chamber via an exhaust gas management system. The chamber 400 also includes an inlet 402 by which a gas 404 may be provided into the chamber. This gas 404 includes a repair material. For example, the gas 404 may include $Cr(CO)_6$ or another metal-containing gas, when patches or repairs of chromium or another metal are desired. The inlet 402 may be configured to permit the gas 404 to enter the chamber 200 at a selectable, controlled flow rate, which may be measured in standard cubic centimeters per minute. When the gas 404 is $Cr(CO)_6$ is used, the flow rate of the gas 404 may range from about 0 standard cubic centimeters per minute to about 40 standard cubic centimeters per minute. In some embodiments, the flow rate of the gas 204 may be controlled by a temperature controller. For example, the temperature used to control the flow of the gas 404 may range from about 0 degrees Celsius to about 40 degrees Celsius.

The repair chamber 400 further includes a second inlet 406 by which the repair chamber 400 is supplied with an assistant gas 408. The assistant gas 408 may be a polar gas or an oxidative gas. In some embodiments, $O_2$ may be included as the gas 408 or as part of the gas 408. The assistant gas 408 may be an oxidative gas. In some embodiments, the assistant gas 408 may be supplied into the repair chamber 400 at a flow rate ranging from about 0 standard cubic centimeters per minute to about 8 standard cubic centimeters per minute via the inlet 406. The gas 402 and the assistant gas 406 may intermix in the repair chamber 404 as a gaseous mixture 410. In some embodiments, the gas 402 and the assistant gas 408 may be mixed prior to introduction into the repair chamber 400.

As illustrated in FIG. 4, the repair chamber 400 includes a repair tool 412. This repair tool 400, which as illustrated in an e-beam repair tool, provides for the disassociation of at least some of the (CO) units from the $Cr(CO)_6$, causing chromium-containing repair material to be deposited in a localized manner at the site 122 to repair the defect 120 by selecting adding repair material. The repair tool 412 may include multiple components, such as an electron source 416 that provides a stream of electrons 415. The stream of electrons 415 interact with the $Cr(CO)_6$ to dissociate one or more of the (CO) units from the $Cr(CO)_6$ molecules, causing at least some of the Cr atoms 417 to be deposited on the surface of the mask 100. These Cr atoms 417 may still be in molecules including one or more (CO) units. However, the dissociation process causes there to be fewer (CO) molecules present with the deposited Cr atoms 417. In order to controllably direct the electrons of the stream of electrons 415, the repair tool 412 may further include steering mechanisms, such as electrostatic and magnetic lenses, to enable the steering of the electron stream. The repair material deposited in a patch within the repair chamber 400 may include nitrogen, carbon, oxygen, and chromium when the gas 404 is $Cr(CO)_6$ and the assistant gas 408 is an oxygen containing gas.

The repair chamber 400 may be controlled by a control system 420. As depicted, the control system 420, which is positioned outside the repair chamber 400, is coupled to a set of valves. The set of valves includes a first valve 422 by which the inlet 406 may be opened, closed, or positioned to provide a specific flow rate of the assist gas 408. Similarly, a second valve 424 may be included in the repair chamber 400 and in communication with the control system 420 to permit the inlet 402 to be opened, closed, or positioned to provide a specific flow rate of the gas 404. By permitting the controllable flow of the gases 404 and 404 through the inlets 402 and 406, respectively, the control system 420 may enable a precise composition of the gaseous mixture 410 to be achieved. In some embodiments, a temperature control may be adjusted by the control system 420 to control the flow rate of the assist gas 408 through the inlet 406.

In experiments, the atomic percentages present in the repair material deposited as described with respect to the repair chamber 400 of FIG. 4 were found to be unexpectedly different that the atomic percentages of repair material deposited as described with respect to the repair chamber 200 of FIG. 2 and the descriptions of FIGS. 3A-D, which provided an unexpected result of increased durability and adhesion in the deposited repair material. This was comparable to the chromium-to-carbon ratio of a 150 nanometer feature produced using a process like that described above in connection with FIGS. 2 and 3A-D. Thus, a significant decrease in the chromium-to-carbon ratio was observed as the feature size being formed by the e-beam deposition tool decreased. The addition of the assistant gas 408 may increase the ratio back above 1 even for features having dimensions smaller than 32 nanometers.

As an unexpected result, the deposition rate was increased for features larger than about 10 nanometers. For larger feature repair or patterning, such as may be used in the main mask pattern of mask 100, the addition of the assistant gas 408 may increase the deposition rate by approximately a factor of four. For small features, such as could be formed in the repair chamber 400 to add or repair a scattering bar, the adhesiveness of the feature was increased by the addition of the assistant gas 408. In an experiment, a scattering bar feature formed using $Cr(CO)_6$ and without the oxygen-containing assistant gas 408 detached after six wet cleaning processes, while corresponding features formed using $Cr(CO)_6$ with assistant gas maintained their height and remained attached beyond six wet cleaning processes.

Figure 5A:
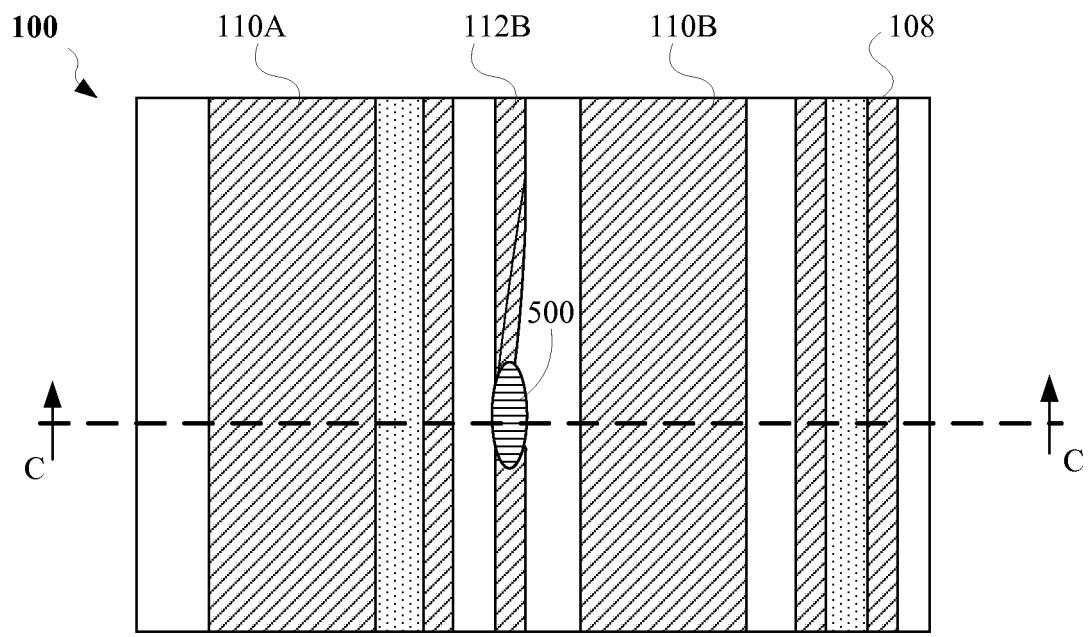
FIG. 5A is a top view of an embodiment of a photomask having a repaired defect thereon, according to some aspects of the present disclosure.
Figure 5B:
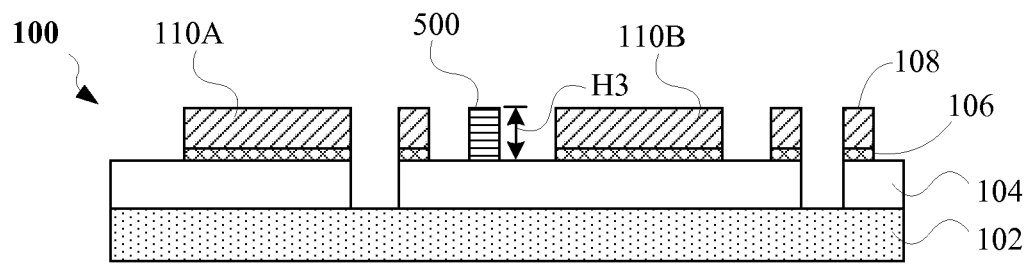
FIG. 5B is a cross-sectional view of the repaired photomask of FIG. 5A, as seen according to line C-C of FIG. 5A, after repair.
Figure 5C:
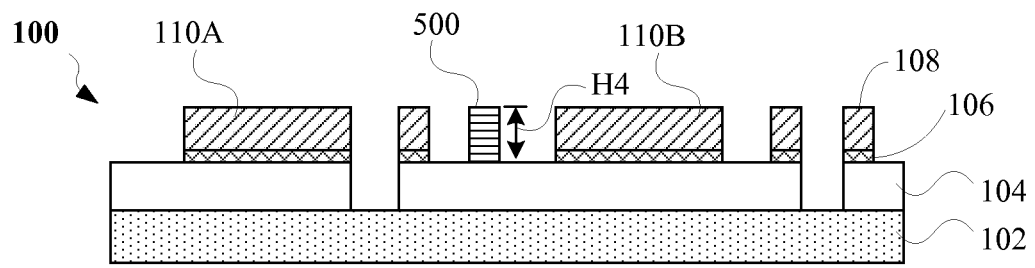
FIG. 5C is a cross-sectional view of the repaired photomask of FIG. 5A, as seen according to line C-C of FIG. 5A, after several cleaning cycles.

Shown in FIGS. 5A and 5B are a top view and a cross-sectional view of the wafer 100 after a repair process is performed using the repair chamber 400 as described herein. The patch 500 is formed from deposited repair material. FIG. 5B illustrates a height H3 of the patch 500 after deposition in the repair chamber 400. The height H3 may be controlled by a combination of the dwell time and the deposition rate, which is influenced by the e-beam and by the flow rate of the gases 404 and 408 in the repair chamber 400. Unlike what is illustrated in FIGS. 3A-D, after several cleanings the height H4 of the patch 500 is approximately the same, as may be observed in FIG. 5C. Thus the patch 500 may be more durable than the patch 300. The deposited repair material of the patch 500 may show increase uniformity or homogeneity which may result in increased strength and durability. The patch 300, formed without the assist gas 408 may, in contrast, have comparatively higher clustering of carbon, leading to comparatively poor performance.

Figure 6:
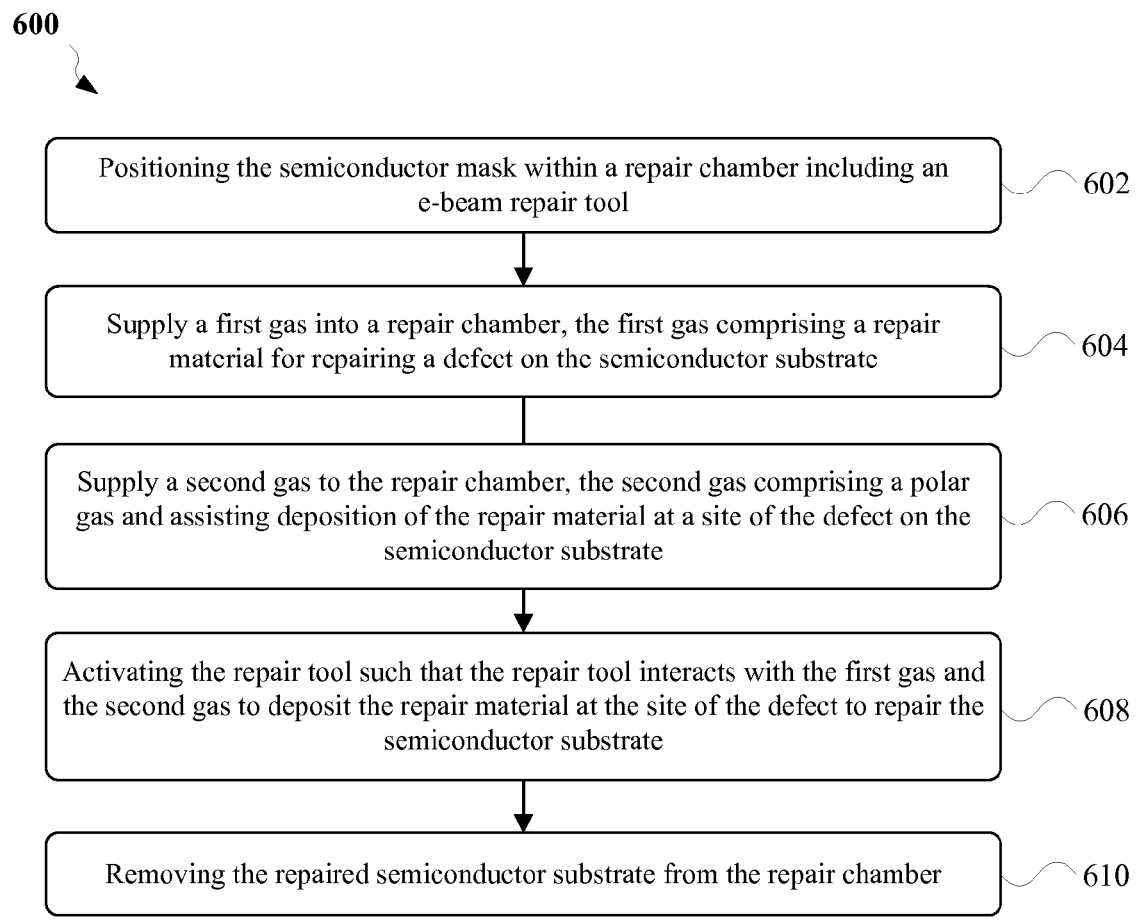
FIG. 6 is a flow chart of a method for repairing substrates according to some aspects of the present disclosure.

Referring now to FIG. 6, a flowchart of a method 600 for repairing a mask defect is shown. As illustrated, the method 600 includes a plurality of steps or operations. Additional operations that are not shown may be included in some embodiments of the method 600. Such additional operations may be performed before, after, and in between the enumerated steps or operations without departing from the scope of the method 600. The method 600 may be performed with a repair chamber 400 as shown in FIG. 4 and described herein.

Embodiments of the method 600 may begin in step 602, in which a semiconductor substrate is positioned within a repair chamber including a repair tool. For example, the substrate may be a semiconductor mask like the mask 100 as seen in FIGS. 1A and 1B may be loaded into the repair chamber 400 of FIG. 4. At step 604, a first gas may be supplied to the repair chamber. The first gas may include a repair material for repairing a defect on the semiconductor mask. For example, the first gas may include a chromium-containing repair material. In some embodiments, the first gas is $Cr(CO)_6$. A flow rate of the first gas into the repair chamber may be controlled by a temperature controller, in some embodiments.

At step 606, a second gas is supplied to the repair chamber. The second gas may comprise a polar gas and may assist deposition of the repair material at a site of the defect on the semiconductor substrate. For example, the second inlet 406 may conduct the gas 408 into the repair chamber 400. The gas 408 may be a polar gas and may be an oxidative gas. In some embodiments, the second gas is an oxygen-containing gas. In other embodiments, the second gas may be $O_2$. The second gas may facilitate the dissociation of some of the CO molecules from the larger $Cr(CO)_6$ molecules, which may result in a more durable deposited repair material compared to methods not including the second gas. In some embodiments, the flow rate of the second gas into the repair chamber is in a range from about 0 standard cubic centimeters per minute to about 8 standard cubic centimeters per minute.

At step 608, the repair tool is activated such that the repair tool interacts with the first gas and the second gas to deposit the repair material at the site of the defect to repair the semiconductor substrate. For example, the repair tool may be an e-beam deposition tool that dissociates the carbon monoxide groups from the $Cr(CO)_6$ molecules to deposit a chromium-containing repair material. The deposited repair material may include chromium, oxygen, carbon, and nitrogen and may have a chromium-to-carbon ratio of more than 1. The deposited repair material may also an oxygen-to-carbon ratio of about 1 or more. The defect may be a damaged or absent scattering bar. In some embodiments, the scattering bar may be intended to have a dimension of less than 32 nanometers. In some embodiments, where the defect is an absence of a desired mask feature, the feature may be produced as part of the repair process. In other embodiments, the defect may be an absence of material from a larger pattern feature.

While the context of semiconductor mask repair is frequently addressed herein, the controlled flow of the assist gas 408 in conjunction with the repair gas 404 may be used in e-beam writing applications more generally. For example, by adding the assist gas 408 into the writing chamber or repair chamber 400, the deposition rate for larger features may be up to four times fast than in a conventional e-beam writing process using the chromium-containing repair gas. For example, the repair chamber 400 may be used as a mask creation tool by which an operator may create other features of a desired layout such as the main pattern features 110A and 110B. These features may be created in a more time-efficient process by including the assist gas 408. The deposited repair material may show increase uniformity or homogeneity which may result in increased strength.

In one embodiment of the present disclosure, a method of repairing a semiconductor mask is provided. The method includes steps of positioning the semiconductor mask within a repair chamber including a repair tool, supplying a first gas to the repair chamber, and supplying a second gas to the repair chamber. The first gas includes a repair material for repairing a defect on the semiconductor mask, and the second gas includes a polar gas and assists or enhances deposition of the repair material at a site of the defect on the semiconductor mask. The defect is an absence of a desired pattern material at the site of the defect. The method further includes steps of activating the repair tool such that the repair tool interacts with the first gas and the second gas to deposit the repair material at the site of the defect to repair the semiconductor mask and removing the repaired semiconductor mask from the repair chamber. A dimension of the deposited repair material is less than about 15 nanometers.

The repair material of the first gas is a chromium-containing material and the second gas is an oxidative gas, in some embodiments. And the second gas may be one of $NO_2$ and $H_2O$, a combination thereof, or another oxidative gas. A flow rate of the second gas may be in a range from about 0 standard cubic centimeters per minute to about 8 standard cubic centimeters per minute. The first gas may be $Cr(CO)_6$ and have a flow rate controlled by a temperature controller in a range from about 0 degrees Celsius to about 40 degrees Celsius. The defect may be at least a partial absence of a scattering bar having a width of less than about 10 nanometers. The deposited repair material may have a chromium-to-carbon ratio of more than one.

In another embodiment, another method of repairing a semiconductor mask is provided and includes steps of positioning the semiconductor mask within a repair chamber including an e-beam repair tool, supplying a first gas into the repair chamber, and supplying a second gas into the repair chamber. The first gas includes a chromium-containing repair material for repairing a defect on the semiconductor mask, and the second gas includes $NO_2$ and assists or enhances deposition of the chromium-containing repair material at a site of the defect on the semiconductor mask. The defect may be an absence of a desired pattern material at the site of the defect. The method further includes activating the repair tool such that the e-beam repair tool interacts with the first gas and the $NO_2$ to deposit chromium material at the site of the defect and removing the repaired semiconductor mask from the repair chamber.

The defect may be an absence of at least a portion of a scattering bar feature. A flow rate of the second gas may be in a range from about 0 standard cubic centimeters per minute to about 8 standard cubic centimeters per minute. The first gas may be $Cr(CO)_6$ and a flow rate of the first gas is controlled by a temperature controller. The temperature set by the temperature controller is in a range from about 0 degrees Celsius to about 40 degrees Celsius.

In yet another embodiment, a method of repairing a semiconductor substrate is provided. The method includes steps of supplying a first gas and a second gas into a repair chamber. The first gas includes a repair material for repairing a defect on the semiconductor substrate and the second gas includes a polar gas and assists or enhances deposition of the repair material at a site of the defect on the semiconductor substrate. The method further includes steps of activating the repair tool such that the repair tool interacts with the first and second gases to deposit the repair material at the site of the defect to repair the semiconductor substrate and removing the repaired semiconductor substrate from the repair chamber.

In some embodiments, the semiconductor substrate may be a semiconductor mask substrate. The repair material of the first gas may be a chromium-containing material and the second gas may be an oxidative gas. In some embodiments, the second gas is an oxygen-containing gas. The second gas may have a flow rate in a range from about 0 standard cubic centimeters per minute to about 8 standard cubic centimeters per minute. The first gas may $Cr(CO)_6$ and have a flow rate controlled by a temperature controller. The temperature may be set by the temperature controller is a range from about 0 degrees Celsius to about 40 degrees Celsius.

The various embodiments of the present disclosure may allow defects to be corrected on semiconductor masks and substrates. The embodiments provide for more durable repairs particularly when the feature size to be repaired or replaced is less than 32 nanometers and may be more accurately shaped. In larger features, the embodiments of the present disclosure may increase the deposition rate up to several times. The embodiments may avoid the accumulation of charge in a semiconductor mask when an e-beam tool is used to repair features smaller than 32 nanometers.

What is claimed is:

1. A method of repairing a semiconductor mask, the method comprising:
   positioning the semiconductor mask within a repair chamber including a repair tool;
   supplying a first gas to the repair chamber, the first gas comprising a repair material for repairing a defect on the semiconductor mask;
   supplying a second gas to the repair chamber, the second gas comprising a polar gas and assisting deposition of the repair material at a site of the defect on the semiconductor mask, wherein in the defect is an absence of a desired pattern material at the site of the defect;
   activating the repair tool such that the repair tool interacts with the first gas and the second gas to deposit the repair material at the site of the defect to repair the semiconductor mask, wherein a dimension of the deposited repair material is less than about 32 nanometers; and
   removing the repaired semiconductor mask from the repair chamber.

2. The method of claim 1, wherein the deposited repair material connects portions of a pattern feature that are disconnected by the absence of the desired pattern material at the site of the defect.

3. The method of claim 2, wherein the repair material of the first gas is a chromium-containing material and wherein the second gas is one of $NO_2$ and $H_2O$.

4. The method of claim 3, wherein a flow rate of the second gas is in a range from about 0 standard cubic centimeters per minute (sccm) to about 8 sccm.

5. The method of claim 2, wherein the first gas is $Cr(CO)_6$ and a flow rate of the first gas is controlled by a temperature controller and wherein a temperature set by the temperature controller is in a range from about 0 degrees Celsius to about 40 degrees Celsius.

6. The method of claim 1, wherein the defect is at least a partial absence of a scattering bar having a width of less than about 10 nanometers and wherein the deposited repair material has a repair material height that is equal to a height of the scattering bar.

7. The method of claim 1, wherein the deposited repair material has a chromium-to-carbon ratio of more than one.

8. The method of claim 1, wherein the deposited repair material has a chromium-to-carbon ratio of more than one.

9. A method of repairing a semiconductor mask, the method comprising:
   positioning the semiconductor mask within a repair chamber including an e-beam repair tool;
   supplying a first gas to the repair chamber, the first gas comprising a chromium-containing repair material for repairing a defect on the semiconductor mask;
   supplying a second gas to the repair chamber, the second gas comprising an oxidative gas and assisting deposition of the chromium-containing repair material at a site of the defect on the semiconductor mask, wherein in the defect is an absence of a desired pattern material at the site of the defect;
   activating the repair tool such that the e-beam repair tool interacts with the first gas and the second gas to deposit chromium material at the site of the defect to repair the semiconductor mask, wherein a dimension of the deposited chromium material is less than about 16 nanometers; and
   removing the repaired semiconductor mask from the repair chamber.

10. The method of claim 9, wherein the dimension of the deposited chromium material is less than about 7 nanometers.

11. The method of claim 9, wherein the deposited chromium material comprises chromium, carbon, oxygen, and nitrogen and has a chromium-to-carbon ratio that is greater than 1.

12. The method of claim 9, wherein the defect is an absence of at least a portion of a scattering bar feature.

13. The method of claim 9, wherein:
   a flow rate of the second gas is in a range from about 0 standard cubic centimeters per minute (sccm) to about 8 sccm,
   the first gas is $Cr(CO)_6$ and a flow rate of the first gas is controlled by a temperature controller, and
   a temperature set by the temperature controller is in a range from about 0 degrees Celsius to about 40 degrees Celsius.

14. A method of repairing a semiconductor substrate, the method comprising:
   supplying a first gas into a repair chamber, the first gas comprising a repair material for repairing a defect on the semiconductor substrate;
   supplying a second gas to the repair chamber, the second gas comprising a polar gas and assisting deposition of the repair material at a site of the defect on the semiconductor substrate;
   activating a repair tool such that the repair tool interacts with the first gas and the second gas to deposit the repair material at the site of the defect to repair the semiconductor substrate, the deposited repair material connecting portions of a patterned feature that are disconnected by the absence of a patterned feature material at the site of the defect; and
   removing the repaired semiconductor substrate from the repair chamber.

15. The method of claim 14, wherein he deposited repair material is deposited on and remains in contact with a multilayer stack formed on the semiconductor substrate.

16. The method of claim 14, wherein the repair material of the first gas is a chromium-containing material and the second gas is an oxidative gas.

17. The method of claim 14, wherein the second gas is one of $NO_2$ and $H_2O$.

18. The method of claim 17, wherein the second gas is $NO_2$ and has a flow rate in a range from about 0 standard cubic centimeters per minute (sccm) to about 8 sccm.

19. The method of claim 14, wherein the first gas is $Cr(CO)_6$ and a flow rate of the first gas is controlled by a temperature controller and wherein a temperature set by the temperature controller is in a range from about 0 degrees Celsius to about 40 degrees Celsius.

20. The method of claim 14, wherein the semiconductor substrate is a semiconductor mask and the patterned feature is a scattering bar having a width of less than about 10 nanometers.

* * * * *